(12) United States Patent
Nammi et al.

(10) Patent No.: US 9,774,476 B2
(45) Date of Patent: Sep. 26, 2017

(54) ADAPTIVE SIGNAL LINEARIZATION

(71) Applicant: Telefonaktiebolaget L M Ericsson (publ), Stockholm (SE)

(72) Inventors: Sairamesh Nammi, Kista (SE); Muhammad Kazmi, Bromma (SE); Tong Liu, Sundbyberg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 92 days.

(21) Appl. No.: 14/705,785

(22) Filed: May 6, 2015

(65) Prior Publication Data

US 2016/0218891 A1    Jul. 28, 2016

Related U.S. Application Data

(60) Provisional application No. 62/106,527, filed on Jan. 22, 2015.

(51) Int. Cl.
*H04L 25/03*    (2006.01)
*H04B 1/04*    (2006.01)
*H04L 27/36*    (2006.01)
*H04W 52/02*    (2009.01)
*H04L 27/26*    (2006.01)
*H04L 12/26*    (2006.01)
(Continued)

(52) U.S. Cl.
CPC ..... *H04L 25/03828* (2013.01); *H04B 1/0475* (2013.01); *H04L 25/03343* (2013.01); *H04L 27/2601* (2013.01); *H04L 27/366* (2013.01); *H04L 43/16* (2013.01); *H04W 24/08* (2013.01); *H04W 36/36* (2013.01); *H04W 52/0206* (2013.01); *H04W 52/0216* (2013.01); *H04W 52/04* (2013.01); *H04B 2001/0425* (2013.01)

(58) Field of Classification Search
None
See application file for complete search history.

(56) References Cited

U.S. PATENT DOCUMENTS 6,748,021 B1 * 6/2004 Daly ............... H04L 1/0003
                                                    370/337
6,999,738 B2 * 2/2006 Gerhaeuser ........ H03F 1/3247
                                                    455/114.2

(Continued)

OTHER PUBLICATIONS

PCT, Notification of Transmittal of the International Search Report and the Written Opinion of the International Seaching Authority, or the Declaration, Int'l Appln No. PCT/IB2016/050125, Mailing Date: May 25, 2016.

(Continued)

*Primary Examiner* — Diane Lo
(74) *Attorney, Agent, or Firm* — Baker Botts, LLP

(57) ABSTRACT

According to some embodiments, a method of transmitting a radio signal in a first wireless network element comprises receiving, at an input of a radio transmitter, a signal for wireless transmission; selectively performing a signal linearization technique on the signal; amplifying the signal with a non-linear amplifier; and transmitting the amplified signal to a second wireless network element. According to particular embodiments, selectively performing the signal linearization technique comprises determining a modulation order of the received signal and determining the modulation order exceeds a modulation order threshold.

26 Claims, 13 Drawing Sheets

(51) Int. Cl.
H04W 24/08 (2009.01)
H04W 36/36 (2009.01)
H04W 52/04 (2009.01)

(56) References Cited

U.S. PATENT DOCUMENTS

| | | |
|---|---|---|
| 8,023,588 B1 | 9/2011 | Benson et al. |
| 2005/0111574 A1 | 5/2005 | Muller et al. |
| 2009/0072900 A1 | 3/2009 | Park et al. |
| 2010/0069023 A1* | 3/2010 | Coan ............... H03F 1/3247 455/114.3 |
| 2013/0315339 A1* | 11/2013 | Robert ............ H04L 25/03343 375/267 |
| 2015/0280657 A1 | 10/2015 | Cheng et al. |

OTHER PUBLICATIONS

Technical Specification, "LTE; Evolved Universal Terrestrial Radio Access (E-UTRA); Base Station (BS) radio transmission and reception (Release 12)," 3GPP TS 36.104 V12.6.0 (Feb. 2015), ETSI TS 136 104; 157 pages, © 2015.

* cited by examiner

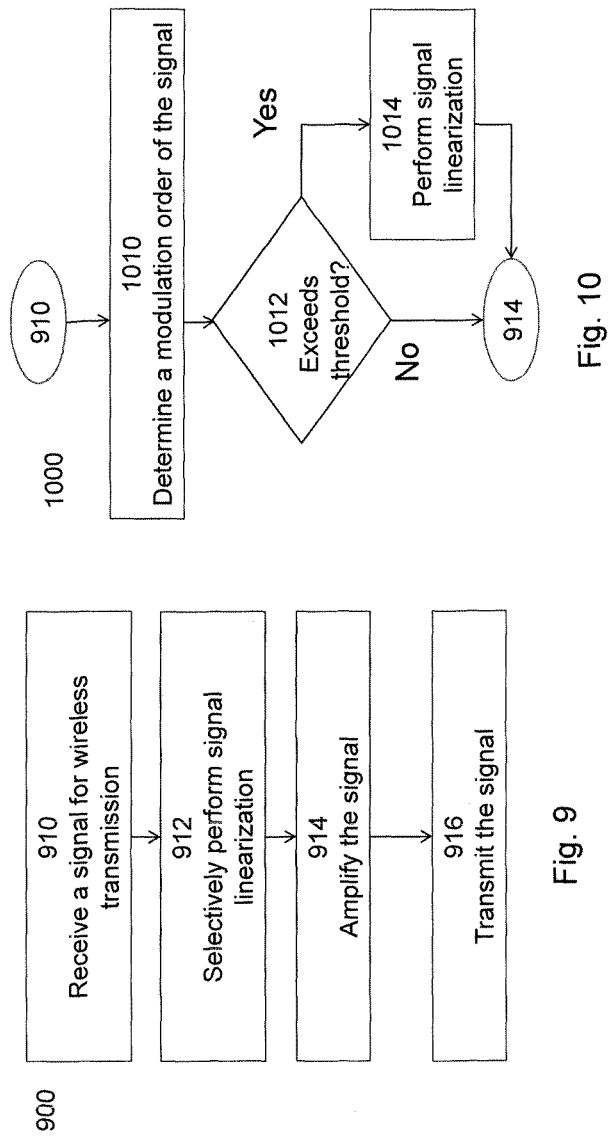

ADAPTIVE SIGNAL LINEARIZATION

RELATED APPLICATION

This application claims benefit under 35 U.S.C.§119(e) to U.S. Provisional Application Ser. No. 62/106,527, entitled "APPLYING SIGNAL LINEARIZATION," filed Jan. 22, 2015, the entire content of which is incorporated herein by reference.

TECHNICAL FIELD

Particular embodiments are directed to adaptive signal linearization, and, more particularly, to selectively applying signal linearization based on, for example, modulation format.

BACKGROUND

A particular goal of Third Generation Partnership Project (3GPP) Long Term Evolution (LTE) is to improve the Universal Mobile Telecommunications System (UMTS) standard. A 3GPP LTE radio interface offers high peak data rates, low delays, and an increase in spectral efficiencies. LTE supports both Frequency Division Duplex (FDD) and Time Division Duplex (TDD), which enables operators to take advantage of both paired and unpaired spectrum because LTE has flexibility in bandwidth (e.g., support for 1.4 MHz, 3 MHz, 5 MHz, 10 MHz, 15 MHz, and 20 MHz bandwidths).

The LTE physical layer achieves higher data rates in part by using turbo coding/decoding and higher order modulations (e.g., 64QAM, 256QAM, etc.). The modulation and coding is adaptive based on channel conditions. Orthogonal Frequency Division Multiple Access (OFDMA) is used for the downlink, and Single Carrier Frequency Division Multiple Access (SC-FDMA) is used for the uplink. A particular advantage of such schemes is that the channel response is flat over a sub-carrier even though the multi-path environment could be frequency selective over the entire bandwidth. This reduces the complexity involved in equalization because a receiver may use simple single tap frequency domain equalizers. OFDMA enables LTE to achieve its goal of higher data rates, reduced latency, and improved capacity/ coverage, all with reduced costs to the operator. The LTE physical layer supports Hybrid Automatic Repeat Request (HARQ), power weighting of physical resources, uplink power control, and Multiple-Input Multiple-Output (MIMO) antenna configurations.

Motivated by a growing number of LTE subscribers worldwide, the 3GPP developed an initiative that uses unlicensed spectrum with LTE alongside licensed spectrum, referred to as LTE-License Assisted Access (LTE-LAA). LTE-LAA enables operators to benefit from additional capacity available from the unlicensed spectrum, particularly in hotspots and corporate environments. With LTE-LAA, the extra spectrum resource, especially on the 5 GHz frequency band, can complement licensed band LTE operation.

FIG. 1 is an example schematic block diagram of a radio transmission circuit of a wireless network element. Circuit 10 includes baseband unit 14, RF chain 16, antenna ports 18, and scheduler decisions 20. Circuit 10 may, for example, comprise a radio transmission circuit of a wireless network element in an LTE or LTE-LAA wireless communication network.

The wireless network element may use a wireless communication protocol comprising several layers from the application layer down to the physical layer. Input bits 12 from upper layers are passed through baseband block 14, which typically comprises a channel encoder, interleaver and rate matcher, modulator, layer mapper, OFDM modulator, etc. (not illustrated). After the baseband signal is generated, it passes through RF chain 16 before it goes to antenna ports 18 for transmission. RF chain 16 typically comprises Digital to Analog Converters (DAC), In-phase/ Quadrature (I/Q) imbalancers, oscillators, and Power Amplifiers (PA) (not illustrated).

Baseband signal generation depends on scheduler decisions 20 from upper layers, such as a layer 2 MAC. Scheduler decisions 20 are also influenced by feedback channel information 22 received over a feedback channel of a wireless receiver. For example, the wireless receiver can determine a suitable modulation and code rate at any given instance. As a particular example, when the receiver receives a good signal to noise ratio, the receiver might prefer a higher order modulation such as 256QAM or 64QAM, and when the receiver receives a low signal to noise ratio, the receiver might prefer a low order modulation such as QPSK or 16QAM.

In general, the power amplifiers in the RF block operate in the non-linear region to achieve good efficiency. An example amplitude-to-amplitude modulation (AM/AM) curve for a power amplifier is shown in FIG. 2.

FIG. 2 is a graphical illustration of an AM/AM curve for a power amplifier. Graph 20 charts a normalized input magnitude before power amplification on the x-axis and a normalized output magnitude after power amplification on the y-axis. Graph 20 shows that the input/output curve is highly non-linear. When the power amplifier operates in the non-linear region, some of the signals are leaked to the other frequency bands (i.e., adjacent carrier bandwidths).

FIG. 3 illustrates an example of spectral regrowth due to power amplifier non-linearity. Graph 30 includes power spectral density plots for non-linear power amplification 32 and ideal power amplification 34. FIG. 3 shows that the power spectral density plot is distorted, and there is a leakage of the desired signal to the adjacent channel bandwidths.

Adjacent Channel Leakage Ratio (ACLR) is used as a metric to measure the leakage due to non-linear power amplification. In FIG. 3, the ACLR with ideal power amplification 34 is around −100 dBc, while with realistic power amplification (with non-linearity 32) the ACLR is around −38 dBc.

One method to compensate for the non-linearity of the power amplifier is to distort the input signal to the power amplifier such that the output signal from the power amplifier is transformed to be close to what it would have been if the power amplifier would have been linear. An example of such a method is called a Digital Pre-Distortion (DPD) technique. In general, DPD may interchangeably be referred to as a signal linearization circuit, component, mechanism, or scheme.

FIG. 4 is an example schematic block diagram of a radio transmission circuit of a wireless network element with digital pre-distortion. Circuit 40 comprises baseband block 14 and RF chain 16 similar to those described in reference to FIG. 1. Additionally, circuit 40 comprises DPD block 42 and DPD extraction block 44.

In circuit 40, $y_1$ is the output signal at the output of the power amplifier of RF chain 16, $x_1$ is the output signal from the baseband block 14, and $z_1$ is the input signal to the power amplifier of RF chain 16. This example considers the impact of nonlinear power amplification. In practical systems, the power amplifier of RF chain 16 may be preceded by many other blocks such as a DAC, local oscillator (LO), etc.

The output signal can be expressed as $y_1=f_1(z_1)$, where $f_1$ is a nonlinear function which characterizes the power amplification. Using DPD, the above equations can be written as $y_2=f_1(g_1(x_1))$, where $g_1$ is the function which characterizes DPD block 42. DPD extraction block 44 is chosen such that $y_2=f_1(g_1(x_1))=G_1 \cdot x_1$, where $G_1$ is the gain of the power amplifier. The above equation shows that if $g_1$ is properly chosen, the output of the power amplifier is linear.

FIG. 5 is a graphical illustration of an example spectral regrowth with DPD. Graph 50 illustrates the power spectral density plots for non-linear power amplification 52, ideal power amplification 54, and power amplification with DPD 56. FIG. 5 shows that the spectral regrowth is reduced when DPD techniques are applied. As illustrated, the plots for ideal power amplification 54 and power amplification with DPD 56 are nearly identical. ACLR in this example is around −100 dBc.

SUMMARY

According to some embodiments, a method of transmitting a radio signal in a first wireless network element comprises receiving, at an input of a radio transmitter, a signal for wireless transmission; selectively performing a signal linearization technique on the signal; amplifying the signal with a non-linear amplifier; and transmitting the amplified signal to a second wireless network element.

According to particular embodiments, selectively performing the signal linearization technique comprises determining a modulation order of the received signal and determining the modulation order exceeds a modulation order threshold.

According to particular embodiments, the method further comprises adjusting one or more thresholds used for selectively performing the signal linearization technique.

According to some embodiments, a wireless network element comprises one or more processors operable to: receive, at an input of a radio transmitter, a signal for wireless transmission; selectively perform a signal linearization technique on the signal; amplify the signal with a non-linear amplifier; and transmit the amplified signal to a second wireless network element.

Particular embodiments may exhibit some of the following technical advantages. Signal linearization techniques consume computational resources and power, but they may not be useful in all situations. For example, radio transmissions using a low order modulation technique may not benefit from a signal linearization technique. Instead of always performing a signal linearization technique, a radio node may selectively perform signal linearization only when signal linearization would be beneficial. Adaptive signal linearization facilitates low complexity, and thus low cost, radio transmitter implementations that do not significantly reduce user throughput and also satisfy 3GPP error vector magnitude (EVM) requirements. In particular embodiments, system capacity is enhanced because a base station may simultaneously serve more wireless devices when a signal linearization technique is applied to only a small subset of wireless devices. This is because the overall processing and power consumption at the base station (or any wireless network element) is reduced when signal linearization is selectively applied.

BRIEF DESCRIPTION OF THE DRAWINGS

For a more complete understanding of particular embodiments and their features and advantages, reference is now made to the following description, taken in conjunction with the accompanying drawings, in which:

FIG. 9 is a flow diagram of an example method in a wireless network element of transmitting a radio signal using adaptive signal linearization, according to some embodiments;

FIGS. 10-13 are flow diagrams of example methods in a wireless network element of selectively performing signal linearization, according to some embodiments;

DETAILED DESCRIPTION

In particular networks, signal linearization techniques (e.g., digital pre-distortion) consume computational resources and power. Signal linearization techniques may not be useful for particular wireless network elements, such as a low complexity LTE-LAA base station. Furthermore, large numbers of LTE-LAA base stations may be deployed within a cell. Thus, relaxing the ACLR requirement of the current 3GPP LTE standard (i.e., minimum ACLR of −45 dBc) to permit LTE-LAA base stations to transmit with low power (e.g., 30 dBm or 24 dBm) may conserve resources.

Relaxing the ACLR requirement, however, may impact EVM. This impact is illustrated in FIG. 6.

Figure 1:
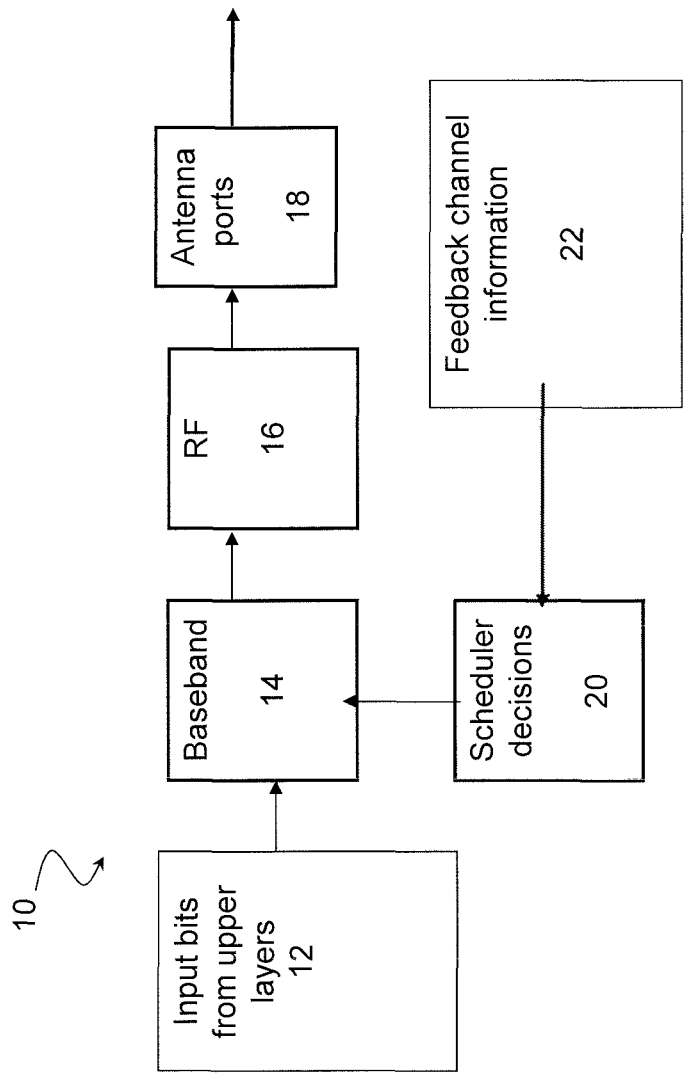
FIG. 1 is an example schematic block diagram of a radio transmission circuit of a wireless network element.
Figure 2:
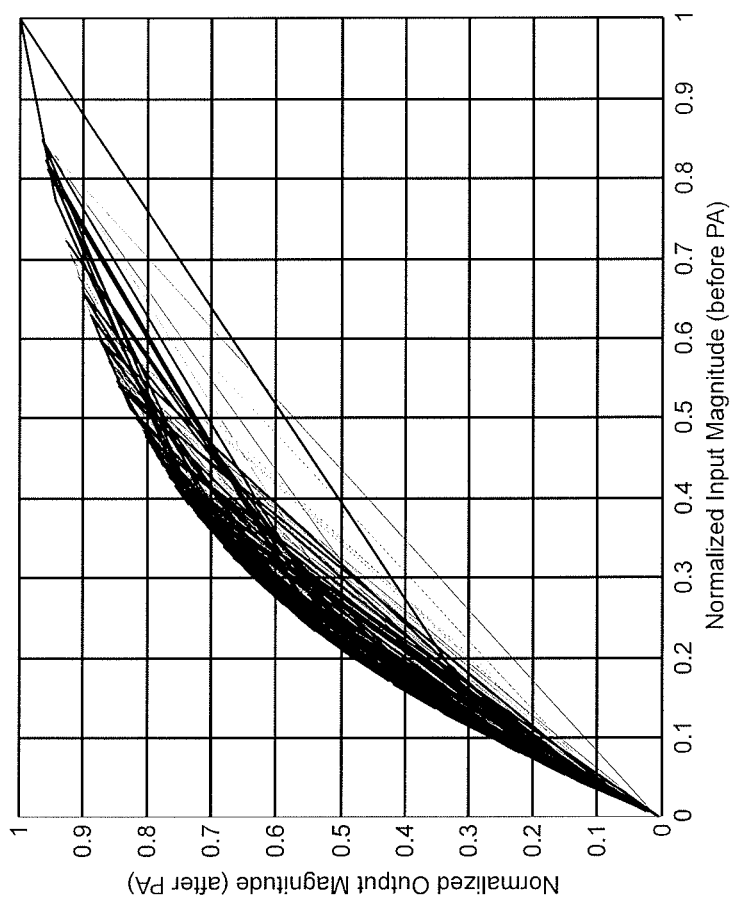
FIG. 2 is a graphical illustration of an AM/AM curve for a power amplifier.
Figure 3:
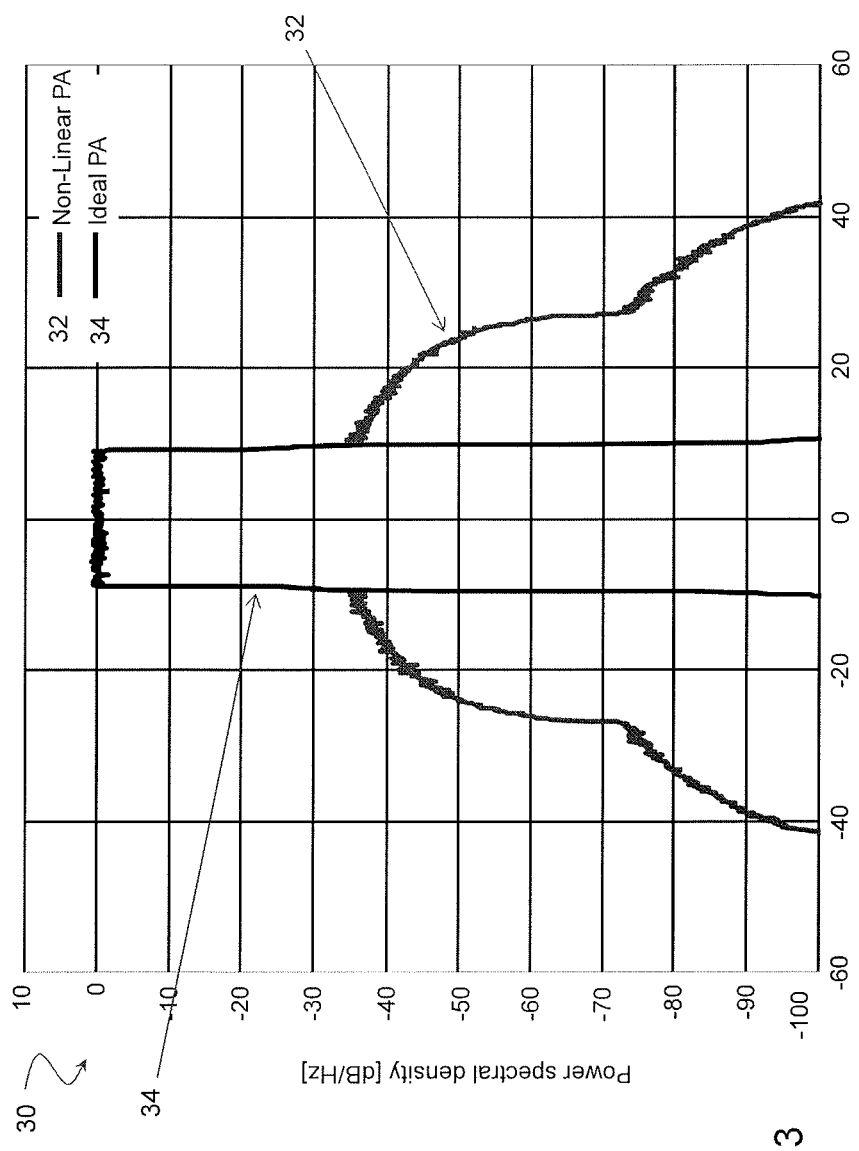
FIG. 3 illustrates an example of spectral regrowth due to power amplifier non-linearity.
Figure 4:
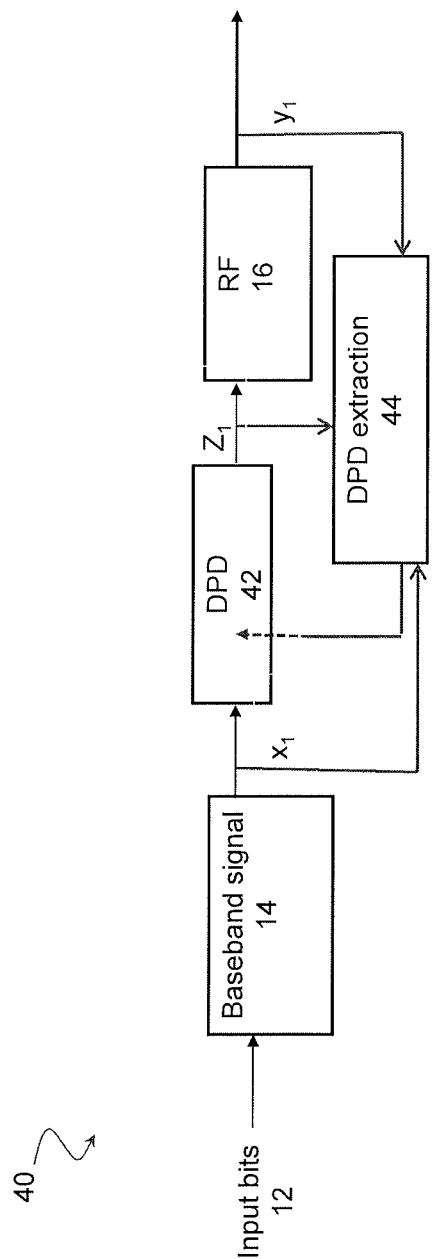
FIG. 4 is an example schematic block diagram of a radio transmission circuit of a wireless network element with digital pre-distortion.
Figure 5:
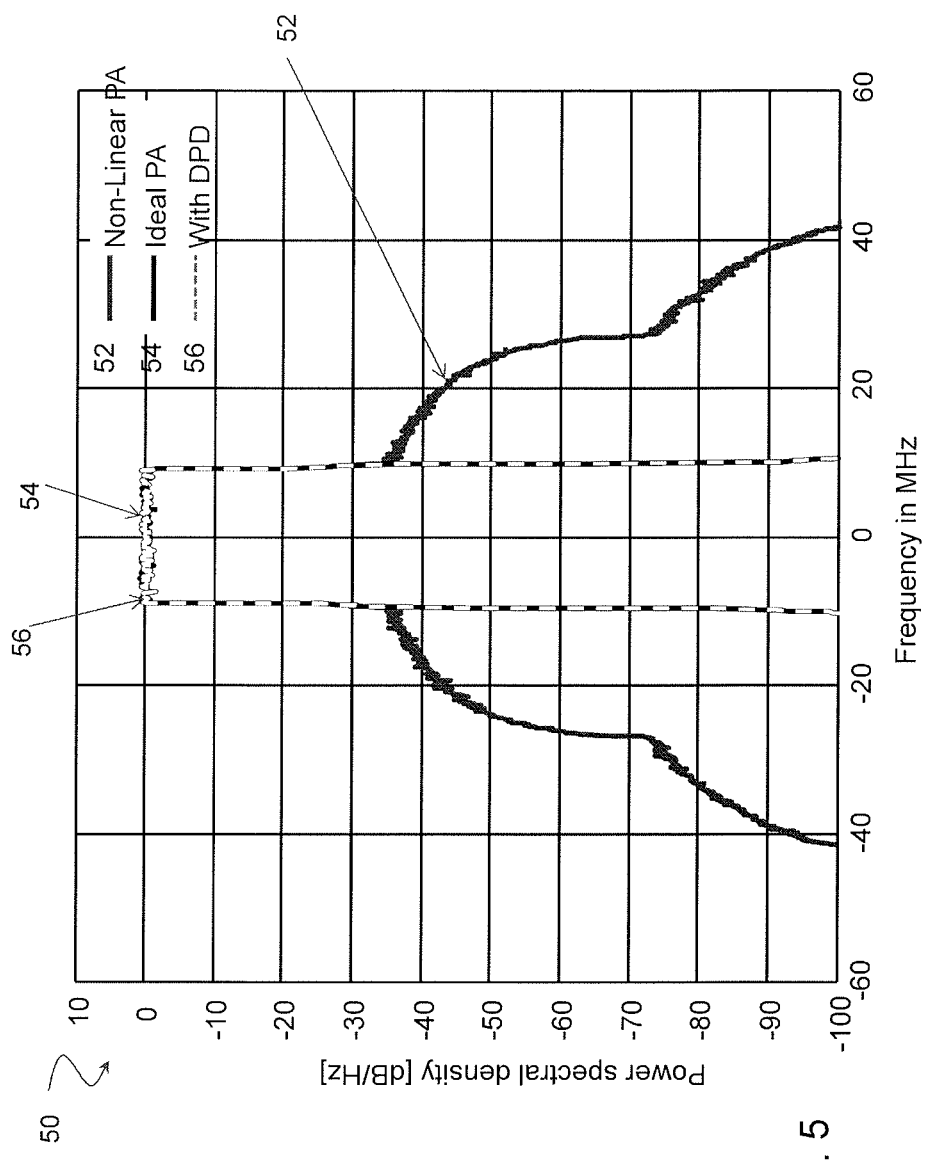
FIG. 5 is a graphical illustration of an example spectral regrowth with DPD.
Figure 6:
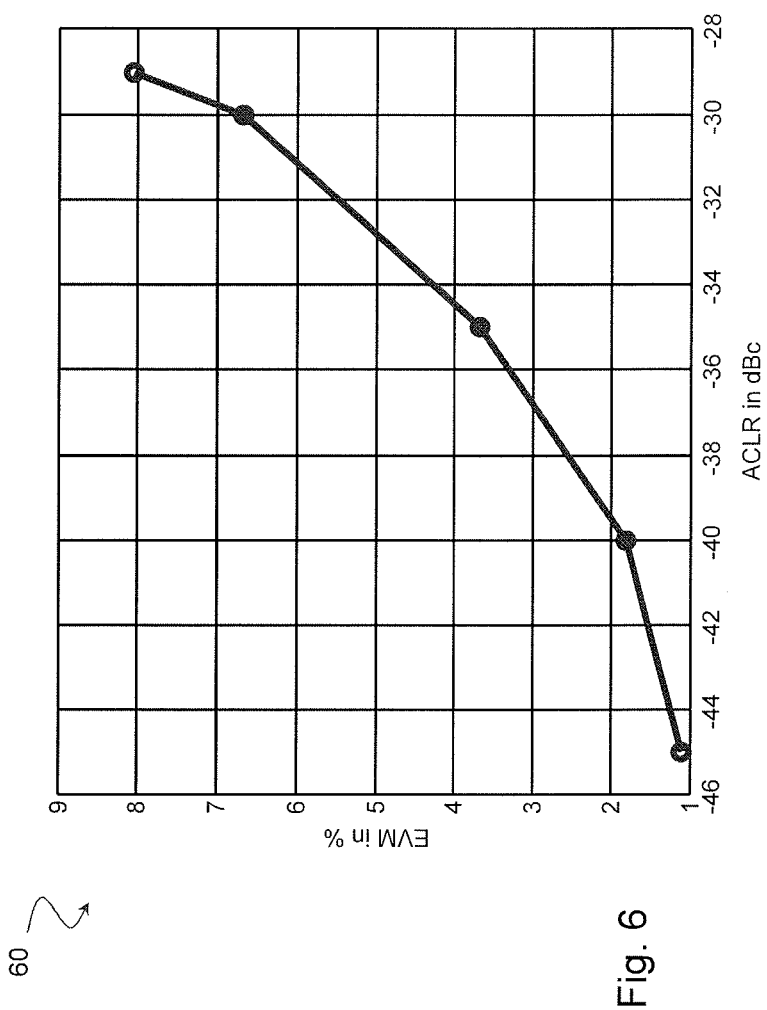
FIG. 6 is a graph illustrating an example relationship between ACLR and EVM for an LTE-LAA power amplifier.

FIG. 6 is a graph illustrating an example relationship between ACLR and EVM for an LTE-LAA power amplifier. Graph 60 charts ACLR in dBc on the x-axis and EVM percentage on the y-axis for a power amplifier in a 5 GHz LTE-LAA base station. Graph 60 illustrates that as the ACLR increases, the EVM also increases.

Relaxing the ACLR to, for example −30 dBc, indicates that the signal at the output of a radio transmitter is non-linear. This increases the EVM at the receiver. Thus, the EVM may exceed the minimum EVM requirement set by the 3GPP.

Table 1 lists the minimum EVM requirement set by the 3GPP for various modulation schemes for an LTE base station.

TABLE 1

EVM requirement of current 3GPP standard

| Modulation | % EVM |
|---|---|
| QPSK | 17.5 |
| 16QAM | 12.5 |
| 64QAM | 8 |
| 256QAM | 3.5 |

The combination of FIG. 6 and Table 1 illustrate that if the ACLR were relaxed to, for example −30 dBc, then the base station could not use 256QAM because an LTE-LAA base station using 5 GHz power amplification could not meet the EVM requirement of 3.5%. In other words, the base station will not be able to schedule a UE with a transport format or Modulation Coding Scheme (MCS) using 256QAM. This in turn may reduce both peak data rate and average data rate and/or throughput in the system.

An object of the present disclosure is to obviate at least these disadvantages and provide an improved method and apparatus to selectively perform signal linearization. Particular embodiments facilitate a low complexity wireless communication system using adaptive modulation that meets the current 3GPP standard requirements for EVM and reduces the complexity for mass/bulk deployment of LTE-LAA systems.

Particular embodiments include a first radio node comprising a transceiver and a hardware processor. The first radio node can determine at least a modulation format or order of a signal at the input of the RF circuitry (e.g. power amplification, RF filter, etc.) within the first radio node. The first radio node can decide, based on the determined modulation format, whether to apply a signal linearization technique (e.g., DPD technique) to the signal prior to the RF circuitry. For example, the first radio node may apply a signal linearization technique to the signal if the modulation order is above a threshold. The first radio node can transmit the signal to a second radio node regardless of whether the signal linearization technique is applied to the signal.

In particular embodiments, the first radio node may determine at least whether the first radio node is capable of selectively applying a signal linearization technique to a signal based on at least the modulation format or order of the signal before transmitting the signal to a second radio node. The first radio node may communicate or transmit the determined information to another radio node (e.g., the second radio node and/or a third radio node).

Particular embodiments may enhance system capacity because more UEs may be simultaneously served when DPD (or a similar technique) is only applied to UEs that are actually using a high order modulation format. In particular embodiments, overall processing at a radio node (e.g., base station) may be reduced when DPD is selectively applied to a subset of the total number of UEs. Power consumption at the radio node (e.g., base station) may be reduced because of a reduction in the processing. Additionally, a UE may experience significant power reduction when applying adaptive DPD because the UE may only use DPD when the signal quality at the receiving node (e.g., base station) is high.

Particular embodiments are described with reference to FIGS. 1-17 of the drawings, like numerals being used for like and corresponding parts of the various drawings. LTE is used throughout this disclosure as an example cellular system, but the ideas presented herein apply to other wireless communication systems as well.

Figure 7:
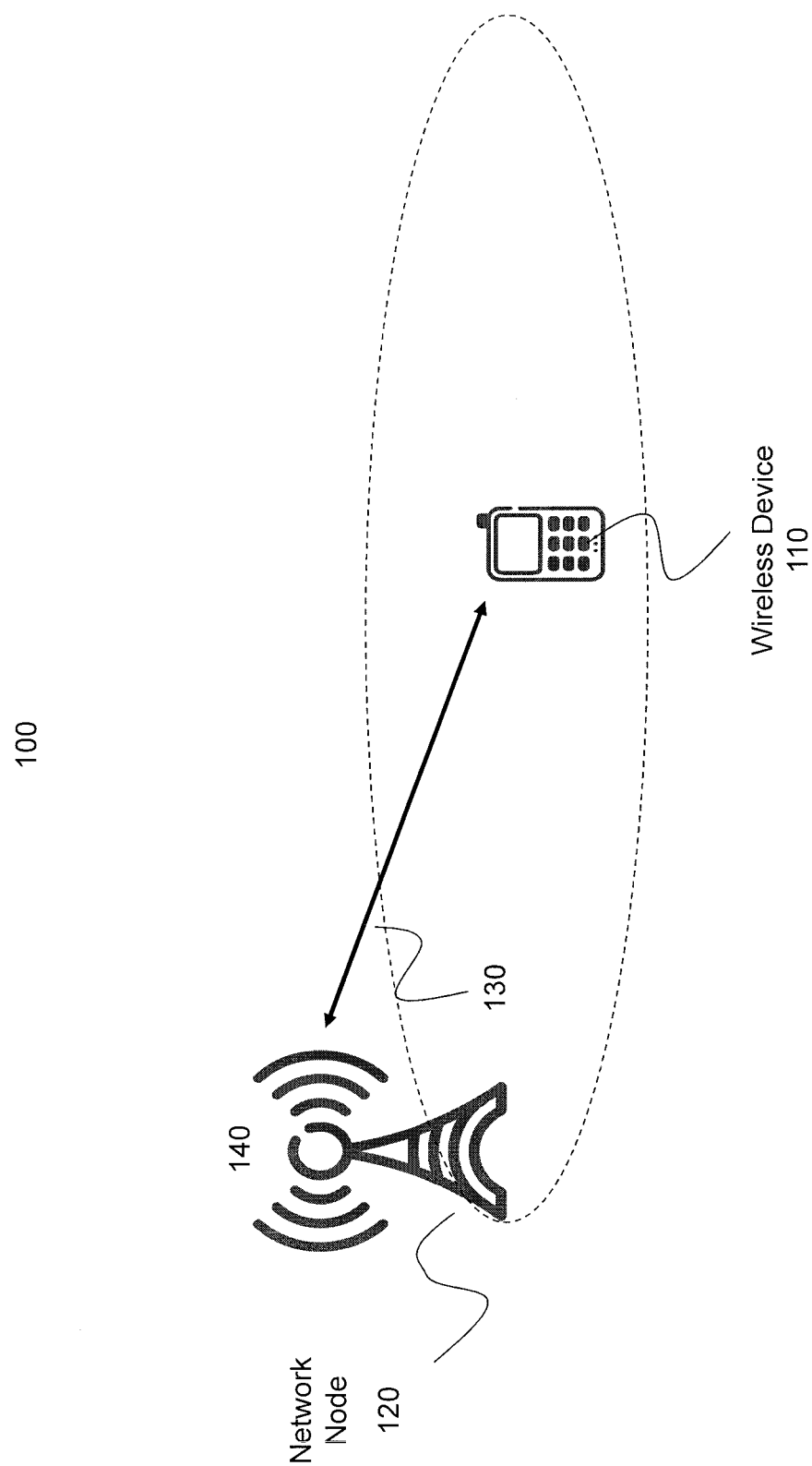
FIG. 7 is a block diagram illustrating an example of a wireless network, according to some embodiments.

FIG. 7 is a block diagram illustrating an example of a wireless network, according to some embodiments. Network 100 includes wireless network elements (also referred to generally a radio node) such as radio network node 120 (such as a base station or eNodeB) and wireless devices 110 (such as mobile phones, smart phones, laptop computers, tablet computers, MTC, or any other devices that can provide wireless communication). In general, wireless devices 110 that are within coverage of radio network node 120 communicate with radio network node 120 by transmitting and receiving wireless signals 130. For example, wireless devices 110 and radio network node 120 may communicate wireless signals 130 containing voice traffic, data traffic, and/or control signals. Wireless signals 130 may include both downlink transmissions (from radio network node 120 to wireless devices 110) and uplink transmissions (from wireless devices 110 to radio network node 120).

Radio network node 120 transmits and receives wireless signals 130 using antenna 140. In particular embodiments, radio network node 120 may comprise multiple antennas 140. For example, radio network node 120 may comprise a multi-input multi-output (MIMO) system with two, four, or eight antennas 140.

Wireless signals 130 (also referred to as radio signals 130) may be modulated according to various modulation schemes such as QPSK, 16QAM, 64QAM, 256QAM, 512QAM, 1024QAM or any other suitable modulation scheme. The modulation scheme of wireless signal 130 may vary over time according to radio conditions. This may be referred to as adaptive modulation. For example, radio network node 120 may modulate wireless signal 130 with a higher order modulation scheme (e.g., 256QAM) under favorable radio conditions or may modulate wireless signal 130 with a lower order modulation scheme (e.g., 16QAM) under less favorable radio conditions.

In particular embodiments, a wireless network element, such as radio network node 120 or wireless device 110, may apply a signal linearization technique to wireless signal 130 before transmitting wireless signal 130. In particular embodiments, the wireless network element may selectively determine whether to apply a signal linearization technique. Application of signal linearization techniques may apply in both the uplink and downlink.

In particular embodiments, linearization techniques applied to a power amplifier include digital pre-distortion techniques. Signal compensation techniques are not limited to the digital domain, however, and particular embodiments may include analog pre-distortion (APD), or any other suitable compensation technique. The general term "signal linearization technique" may refer to some, any, or all of these techniques.

Some embodiments may refer to several wireless network elements or several radio nodes (e.g., first radio node, second radio node, third radio node, etc.). In some embodiments, the first radio node may transmit signals to the second radio node. As a particular example, the first and the second radio nodes may comprise a base station and UE respectively, or vice versa. In particular embodiments, the third radio node may be neighboring to or connected to the second radio node.

In network 100, each radio network node 120 may use any suitable radio access technology, such as long term evolution (LTE), LTE-Advanced, UMTS, HSPA, GSM, cdma2000, WiMax, WiFi, and/or other suitable radio access technology. Network 100 may include any suitable combination of one or more radio access technologies. For purposes of example, various embodiments may be described within the context of certain radio access technologies. However, the scope of the disclosure is not limited to the examples and other embodiments could use different radio access technologies. For example, particular embodiments may apply to 5G systems and/or LTE-LAA systems.

As described above, embodiments of a network may include one or more wireless devices and one or more different types of radio network nodes capable of communicating with the wireless devices. The network may also include any additional elements suitable to support communication between wireless devices or between a wireless device and another communication device (such as a landline telephone). A wireless device may include any suitable combination of hardware and/or software. For example, in particular embodiments, a wireless device, such as wireless device 110, may include the components described below with respect to FIG. 16. Similarly, a radio network node may include any suitable combination of hardware and/or software. For example, in particular embodiments, a radio network node, such as radio network node 120, may include the components described below with respect to FIG. 17.

Figure 8:
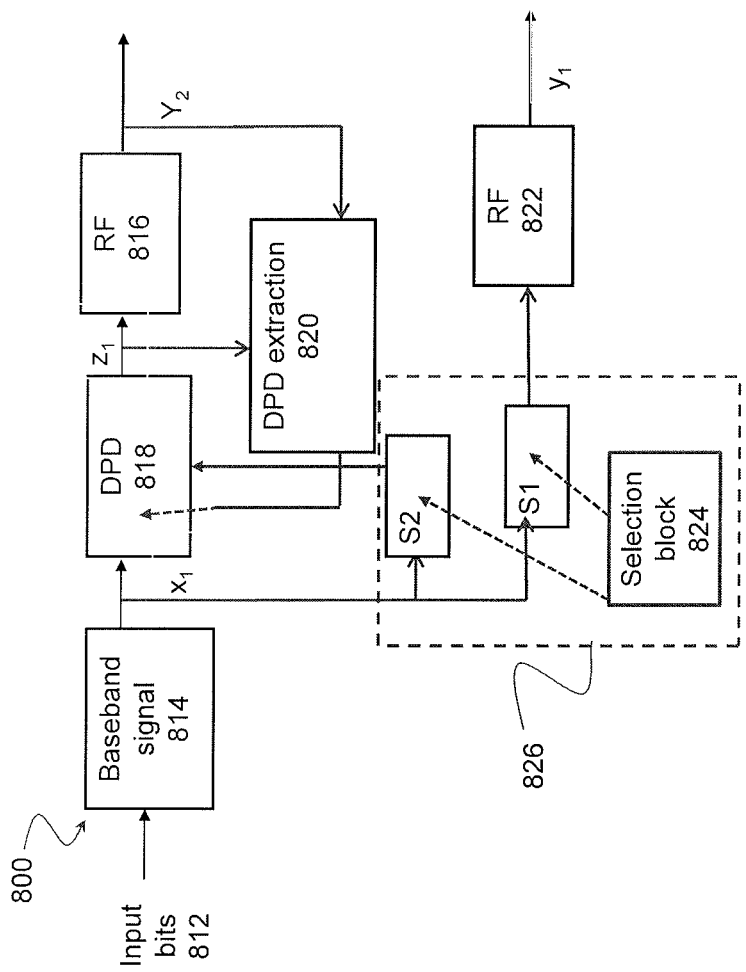
FIG. 8 is an example schematic block diagram of a radio transmission circuit of a wireless network element using adaptive signal linearization, according to some embodiments.

FIG. 8 is an example schematic block diagram of a radio transmission circuit of a wireless network element using adaptive signal linearization, according to some embodiments. Circuit 800 comprises baseband block 814, RF chain 816, DPD block 842 and DPD extraction block 844 similar to similarly numbered components described above in reference to FIGS. 1 and 4. Circuit 800 also comprises switches S1 and S2 controlled by selection block 824.

Selection block 824 determines whether to operate switch S1 or switch S2. When selection block 824 closes switch S1, the signal from baseband block 814 is transmitted through S2 to RF chain 822, bypassing the signal linearization circuitry (i.e., DPD 818 and DPD extraction 820). When selection block 824 closes switch S2, the signal from baseband block 814 is transmitted through S2 to DPD 818 and RF chain 816, where a signal linearization technique is applied to the signal before amplification and transmission.

Although RF chain 822 is illustrated as separate from RF chain 816, in some embodiments RF chain 816 and RF chain 822 may comprise the same RF chain. For example, the signal from baseband block 814 may pass through switch S1 and then directly to RF chain 816 bypassing DPD components 818 and 820.

In particular embodiments, switches S1 and S2 and selection block 824 may comprise a single logic module 826. Logic module 826 represents any components operable to perform the functions described herein with respect to switches S1 and S2 and selection block 824 and logic module 826 may be implemented using any suitable combination of hardware, firmware, and/or software.

In particular embodiments, many components of network 100 may include an adaptive signal linearization circuit, such as example circuit 800. For example, radio network node 120 and wireless device 110 may each include a circuit 800.

In example circuit 800, y1 is the output signal at the output of the power amplifier of RF chain 822, x1 is the output signal from baseband module 814, and z1 is the input signal to the power amplifier of RF chain 816. In particular embodiments, the power amplifiers of RF chains 816 and/or 822 may be preceded by other blocks such as a digital to analog converter (DAC), a local oscillator (LO), etc. (not illustrated). The impact of nonlinear power amplification may be considered using the following equations.

The output signal can be expressed as $y_1=f_1(z_1)$, where $f_1$ is a nonlinear function that characterizes the power amplifier of RF chain 816. Then, $y_2=f_1(z_1)$, $m<M_T$ and $y_2=f_1(g_1(x_1))$, $m \geq M_{Th}$, where $g_1$ is the function which characterizes DPD block 818 and m is the constellation number of bits for representing one modulation symbol or modulation alphabet (not OFDM symbol). For example, for MQAM, $m=\log 2$ (M). For 256QAM, m=8 bits per modulated symbol. The constant $M_{Th}$ is a pre-determined threshold. DPD extraction block 820 may be chosen such that $y_2=f_1(g_1(x_1)) \approx G_1 \cdot x_1$, where $G_1$ is the gain of the power amplifier of RF chain 816.

Example circuit 800 may adaptively apply a signal linearization technique to an input signal selectively based on one or more criteria or conditions. In particular embodiments, the criteria may at least be based on the modulation format of the signal to be transmitted. After adaptively applying the signal linearization technique, the signal passes through RF chain 816 for further processing and circuit 800 transmits the processed signal to another radio node. Examples of additional RF circuitry include power amplifiers, RF filters, antennas, and/or any other suitable radio transmission equipment.

In particular embodiments, selection block 824 determines which switch to select based on a modulation format. For example, selection block 824 may close switch S2 and apply a signal linearization technique when the modulation format or order of the signal exceeds a pre-determined threshold (e.g., greater than 16QAM, or greater than 64QAM). As a particular example, if the signal is using 256QAM or 64QAM, selection block 824 may operate switch S2 to include the DPD circuit (loop). Otherwise, selection block 824 may operate switch S1 to transmit the RF signal without applying a linearization technique, thus saving computational resources and power. Particular embodiments may apply to any modulation order (e.g., 512QAM, 1024QAM, and so on) above any suitable threshold.

In particular embodiments, selection block 824 determines whether to operate switch S1 or S2 based on input from RF chain 816, baseband block 814, or any other suitable component of circuit 800. For example, in particular embodiments selection block 814 may identify the value of m (or M) by re-converting the analog signal just before the input to the power amplifier of RF chain 816 back to a baseband signal. In a particular embodiment, baseband block 814 may identify the value of m (or M) and convey the information to selection block 824. For example, based on the scheduling decision, baseband block 814 may identify the value of m (or M).

FIG. 9 is a flow diagram of an example method in a wireless network element of transmitting a radio signal using adaptive signal linearization, according to some embodiments. In particular embodiments, one or more steps of method 900 may be performed by components of network 100 described with reference to FIGS. 1-17.

The method begins at step 910 where the wireless network element receives a signal for wireless transmission. For example, radio network node 120 may include circuit 800 and may receive a wireless signal at baseband block 814.

At step 912, the wireless network element selectively performs signal linearization. For example radio network node 120 may include circuit 800 and selection block 824 may determine whether to route the signal through the linearization circuitry based on some criteria. Example criteria for selectively performing signal linearization are described in more detail with reference to FIGS. 10-13.

At step 914, the wireless network element amplifies the signal. For example, radio network node 120 may include circuit 800 and the non-linear power amplifier of RF chain 816 may perform amplification on the signal.

At step 916, the wireless network element transmits the radio signal. For example, radio network node 120 may include circuit 800 and RF chain 816 may transmit the radio signal to another radio network element, such as wireless device 110.

Modifications, additions, or omissions may be made to method 900. Additionally, one or more steps in method 900 of FIG. 9 may be performed in parallel or in any suitable order. Particular steps of method 900 may be repeated as necessary. Although the example in method 900 describes a radio network node transmitting a radio signal to a wireless device, in some embodiments, a wireless device may use the same or similar steps to transmit a radio signal to a radio network node.

FIGS. 10-13 are flow diagrams of example methods in a wireless network element of selectively performing signal linearization, according to some embodiments. For example, the methods of FIGS. 10-13 may be performed as part of example step 912 of FIG. 9. In particular embodiments, one or more steps of methods 1000, 1100, 1200 and 1300 may be performed by components of network 100 described with reference to FIGS. 1-17. Although the examples in methods 1000, 1100, 1200 and 1300 describe a radio network node selectively performing signal linearization, in some embodiments, a wireless device may use the same or similar steps to selectively perform signal linearization.

FIG. 10 is a flow diagram of an example method in a wireless network element of selectively performing signal linearization based on a modulation order, according to some embodiments. At step 1010, a wireless network element determines a modulation order of a signal. For example, radio network node 120 may include circuit 800. As described above, selection block 824 may determine a modulation order based on input from RF chain 816, baseband block 814, or any other suitable component of circuit 800.

At step 1012, the wireless network element determines whether the modulation order exceeds a modulation order threshold. For example, in particular embodiments a modulation order threshold value may equal 64QAM. If selection block 824 determines the modulation order of the signal exceeds 64QAM (e.g., 256QAM), then selection block 824 may determine to perform signal linearization on the signal and the method continues to step 1014.

If selection block 824 determines the modulation order of the signal is 64QAM or below (e.g., 16QAM), then selection block 824 may conserve computational resources by determining not to perform signal linearization on the signal. In particular embodiments, the wireless network element may dynamically adjust the modulation order threshold over time. For example, a wireless network element may raise or lower the modulation order threshold based on cell load, capabilities of other wireless network elements, or any other suitable criteria.

Figure 11:
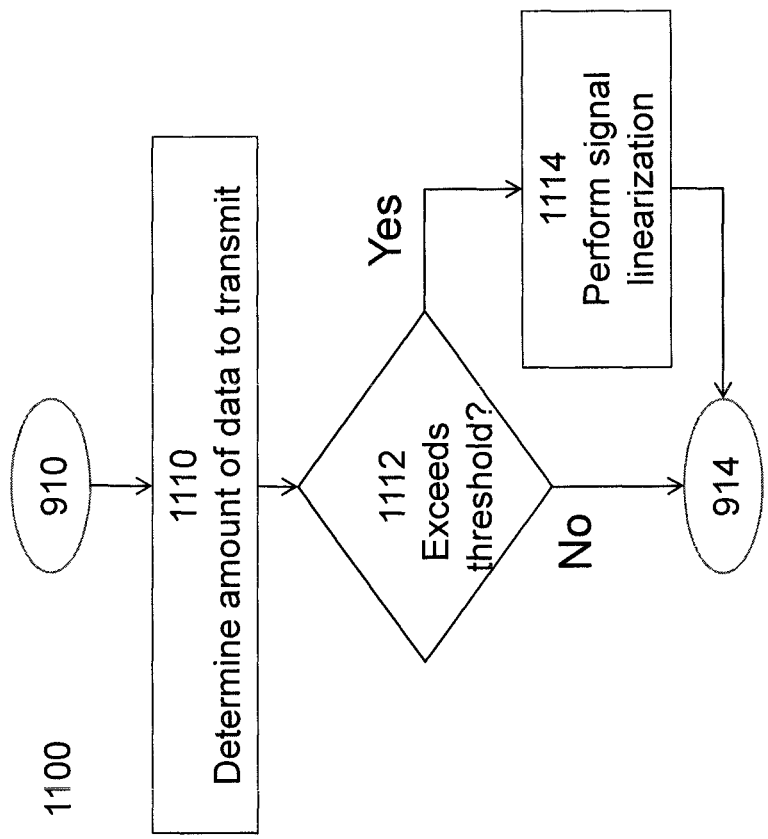

FIG. 11 is a flow diagram of an example method in a wireless network element of selectively performing signal linearization based on an amount of data to transmit, according to some embodiments. At step 1110, a wireless network element determines an amount of data in a buffer to be transmitted to another wireless network element. For example, radio network node 120 may determine how much data is in its buffer to send to wireless device 110. If the buffer contains a large amount of data, then the radio network node may want to use a higher order modulation (e.g., 256QAM) to increase the data rate. Conversely, for small amounts of data, the radio network node may choose a lower order modulation (e.g., QPSK).

At step 1112, the wireless network element determines whether the amount of data exceeds a data amount threshold. In particular embodiments, if selection block 824 determines the amount of data exceeds a data amount threshold, then selection block 824 may determine to perform signal linearization on the signal and the method continues to step 1114.

If the wireless network element determines the amount of data does not exceed the data amount threshold, then selection block 824 may conserve computational resources by determining not to perform signal linearization on the signal. In particular embodiments, the wireless network element may dynamically adjust the data amount threshold over time. For example, a wireless network element may raise or lower the data amount threshold based on cell load, capabilities of other wireless network elements, or any other suitable criteria.

Figure 12:
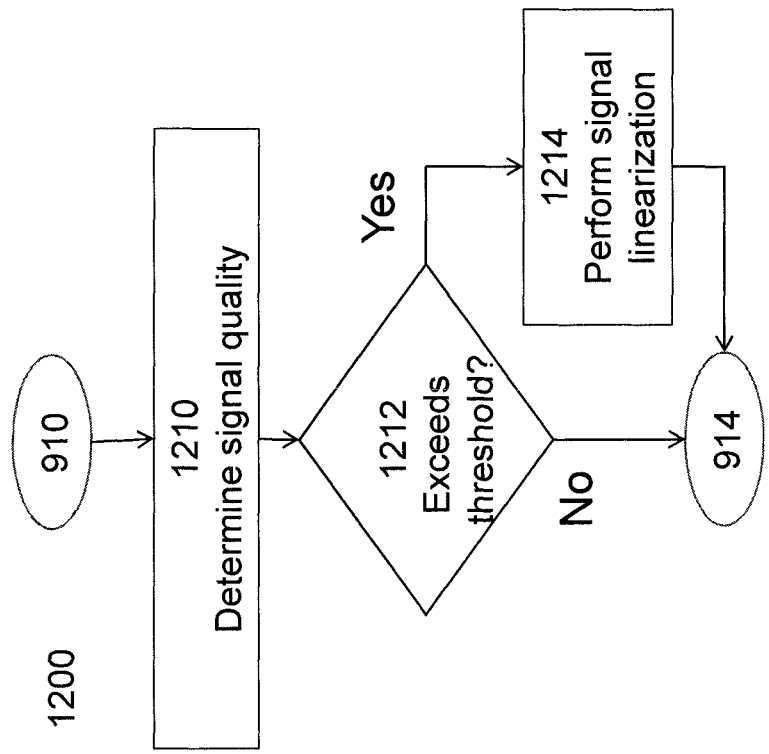

FIG. 12 is a flow diagram of an example method in a wireless network element of selectively performing signal linearization based on a signal quality, according to some embodiments. At step 1210, a wireless network element determines a signal quality. For example, radio network node 120 may determine a quality of a radio signal received at wireless device 110. Examples of signal quality include CSI such as Channel Quality Indication (CQI), Reference Signal Received Quality (RSRQ), Signal to Interference plus Noise Ratio (SINR), Signal to Noise Ratio (SNR), etc. For good signal quality, the radio network node may choose a higher order modulation (e.g., 256QAM). Conversely, for poor signal quality, the radio network node may choose a lower order modulation (e.g., QPSK).

At step 1212, the wireless network element determines whether the signal quality exceeds a signal quality threshold. In particular embodiments, if selection block 824 determines signal quality exceeds a signal quality threshold, then selection block 824 may determine to perform signal linearization on the signal and the method continues to step 1214.

If the wireless network element determines the signal quality does not exceed the signal quality threshold, then selection block 824 may conserve computational resources by determining not to perform signal linearization on the signal. In particular embodiments, the wireless network element may dynamically adjust the signal quality threshold over time. For example, a wireless network element may raise or lower the signal quality threshold based on cell load, capabilities of other wireless network elements, or any other suitable criteria.

Figure 13:
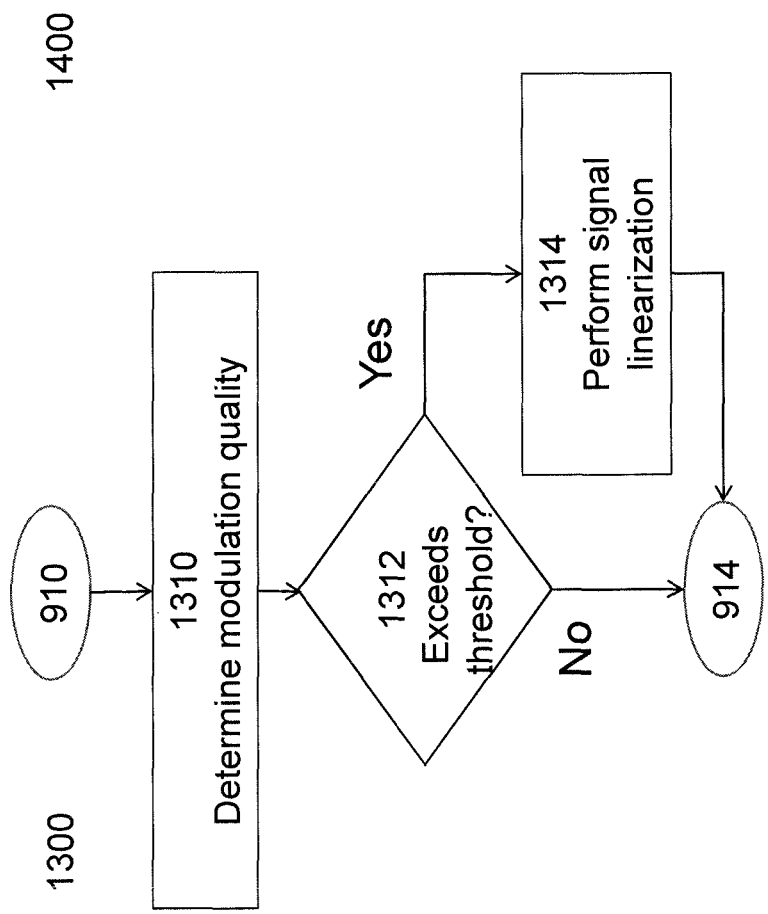

FIG. 13 is a flow diagram of an example method in a wireless network element of selectively performing signal linearization based on a modulation quality, according to some embodiments. At step 1310, a wireless network element determines a modulation quality. For example, radio network node 120 may determine a modulation quality of a radio signal to transmit to wireless device 110. Examples metrics for measuring modulation quality include EVM, frequency error, etc.

At step 1312, the wireless network element determines whether the modulation quality exceeds a signal quality threshold. In particular embodiments, if selection block 824 determines signal quality exceeds a signal quality threshold (e.g., EVM exceeds 5%), then selection block 824 may determine to perform signal linearization on the signal and the method continues to step 1314.

If the wireless network element determines the signal quality does not exceed the signal quality threshold, then selection block 824 may conserve computational resources by determining not to perform signal linearization on the signal. In particular embodiments, the wireless network element may dynamically adjust the modulation quality threshold over time. For example, a wireless network element may raise or lower the modulation quality threshold based on cell load, capabilities of other wireless network elements, or any other suitable criteria.

In particular embodiments, additional criteria or combinations of criteria may be used to selectively perform signal linearization. For example, selective signal linearization may be based on cell load or capabilities of other radio network elements.

As a particular example, cell load may be expressed in terms of a number (K) of second radio nodes (e.g., UEs) to be served or scheduled by a first radio node (e.g., base station). For example, if K is above a threshold then the first radio node may apply a signal linearization technique only to a selected set of signals (e.g., to signals with modulation order above a second threshold, such as 64QAM). Otherwise, at a low load (i.e., K is below the threshold) the first radio node may apply a signal linearization technique to larger set of signals (e.g., to signals with modulation order above a first threshold, such as 16QAM). An advantage of particular embodiments is that processing may be reduced at the first radio node when cell load is high.

As another example, a first radio node may consider the modulation formats supported by a second radio node. In particular embodiments, the first radio node may acquire the capability by receiving it from the second radio node via an explicit signaling message. For example, if the second radio node is not capable of receiving a signal modulated with 256QAM, then the first radio node may determine not to apply a signal linearization technique to radio signals transmitted to the second radio node. In particular embodiments, after the first radio node determines the second radio is not capable of receiving a signal modulated with 256QAM, the first radio node may not need to determine whether to apply signal linearization for each transmission and may instead always transmit to the second radio node without performing signal linearization.

As another example, a first radio node may consider its own capabilities. The hardware capability of the first radio node may be expressed in terms of processors, memory units, etc., for processing signals. This may include the capability of a signal linearization processing unit to process a number of radio signals either over a unit of time or in parallel at the same time (e.g., within the same time slot, subframe, TTI, frame, etc.).

In particular embodiments, if the first radio node has limited hardware capability (e.g., limited processors, etc.) then the first radio node may not apply a signal linearization technique to signals transmitted to a certain number of second radio nodes. For example, the first radio node may adapt the modulation format (e.g., only use a modulation format below a threshold). In another example, if the first radio node has high processing capabilities and cell load is high, then the first radio node may apply a signal linearization technique to all signals which are modulated with a higher order modulation (i.e., with a modulation order above a threshold).

Selectively determining whether to apply a signal linearization technique may be performed at various times. For example, in particular embodiments a first radio node may determine whether to apply a signal linearization technique during every scheduling time instance, over plurality scheduling time instances, or any other suitable period.

In particular embodiments, a radio node may determine the time period for determining whether to apply a signal linearization technique based on a capability of the radio node. As a particular example, if the modulation format of a radio signal is expected to change frequently (e.g., a signal quality, such as SINR, varies with each TTI), then a more frequent time period for determining whether to apply a signal linearization technique may have advantages.

In particular embodiments, a first radio node using adaptive modulation may determine a modulation format for a signal at every scheduling time instance (e.g., every TTI, subframe, frame, etc.). The first radio node may also collect statistics of the modulation formats applied to signals transmitted to the same second radio node over a plurality of scheduling time intervals (e.g., over L number of TTIs). The first radio node may also assess or evaluate one or more additional criteria for applying a signal linearization technique over a shorter time period (e.g., TTI, subframe, frame, etc.). In particular embodiments, the first radio node may assess one or more additional criteria over a longer time period (e.g., multiple frames, 1 or more seconds, etc.).

In particular embodiments, a first radio node may determine, based on one or more criteria assessed during a shorter time period (e.g. over one scheduling time instance), whether to apply a signal linearization technique at every scheduling time instance (e.g., every subframe). For example, the first radio node may apply a signal linearization technique in one subframe (e.g., if a modulation order is above a threshold) while it may not apply the signal linearization technique in the next subframe (e.g., if the modulation order is below the threshold).

In particular embodiments, a first radio node may determine, based on one or more criteria assessed during a longer time period (e.g., over plurality of scheduling time instances), whether to apply a signal linearization technique during the next L time instances (e.g., 20 subframes). For example, the first radio node may apply a signal linearization technique in P number of subframes (e.g., if a majority of modulation orders is above a threshold over the assessed time period) while it may not apply the signal linearization technique in the next Q number of subframes (e.g., if the majority of modulation orders is below the threshold).

In some embodiments, radio nodes may signal information about selectively applying signal linearization techniques to other radio nodes. For example, a first radio node (e.g., base station or UE) may transmit information about adaptive signal linearization capabilities of the first radio node to a second radio node (e.g., another base station or UE). In particular embodiments, the second radio node may be the radio node that will receive the radio signal (e.g., a base station is the first radio node and a UE is the second radio node). In particular embodiments, the second radio node may be a radio node different than the radio node that is to receive the radio signal (e.g., a base station is the first radio node and a different base station is the second radio node).

Examples of information about adaptive signal linearization capabilities include the following:

An indication of whether a first radio node is capable of selectively applying a signal linearization technique to a transmitted signal;

An indication of whether a signal linearization technique was applied to transmitted signals in the last G number of time instances (e.g., subframes) and/or will be applied to transmitted signals in the next H number of time instances (e.g., subframes);

A time unit for which the adaptive signal linearization is applied or can be applied (e.g., every subframe);

The modulation format or order for which a signal linearization technique is applied (e.g., for 64QAM or above; and/or Any suitable parameter or combination of parameters related to adaptive signal linearization.

Figure 14:
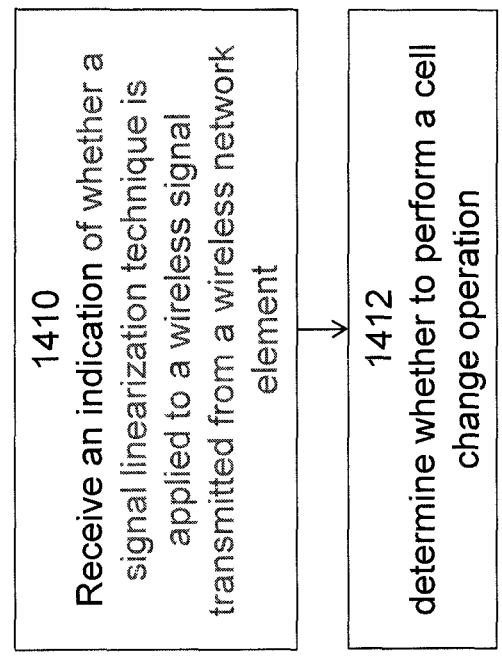
FIGS. 14 and 15 are flow diagrams of example methods of receiving information indicating that a signal linearization technique is applied to a wireless signal.
Figure 15:
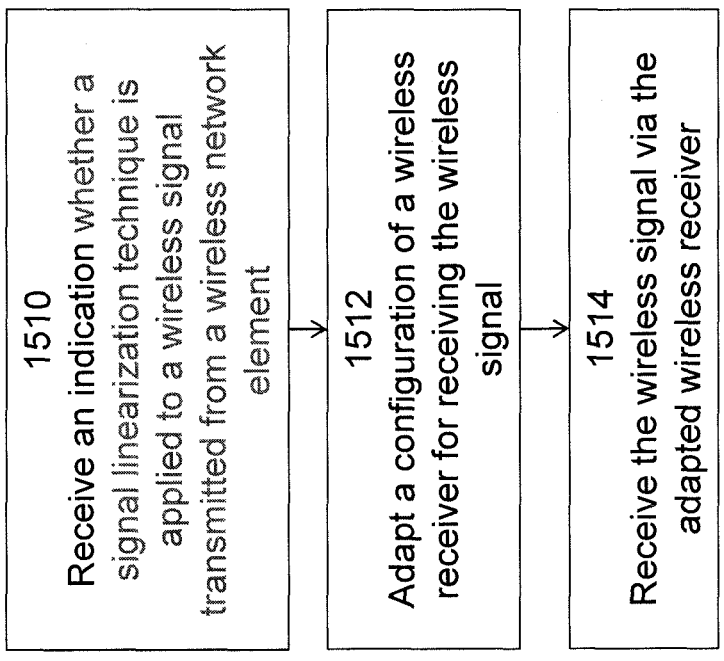

FIGS. 14 and 15 are flow diagrams of example methods of receiving information indicating that a signal linearization technique is applied to a wireless signal.

FIG. 14 is a flow diagram of an example method in a wireless network element of receiving information of whether a signal linearization technique is applied to a wireless signal, according to some embodiments. In particular embodiments, one or more steps of method 1400 may be performed by components of network 100 described with reference to FIGS. 1-17.

The method begins at step 1410 where the wireless network element receives information indicating that a signal linearization technique is applied to a wireless signal. For example, a first radio network node 120 may receive information that a second radio network node 120 is capable of applying a signal linearization technique to a wireless signal that will be transmitted to a wireless device 110. In particular embodiments, a wireless network element may receive any suitable information about adaptive signal linearization capabilities of another wireless network element.

In some embodiments, the first wireless network element, such as first radio network node 120, may use the received adaptive signal linearization information for performing one or more tasks. In particular embodiments, the first wireless network element may use the received adaptive signal linearization information to make a cell change decision.

At step 1412, the wireless network element determines whether to perform a cell change operation. For example, a first base station may prefer to handover a UE requiring a high data rate to a second base station that is capable of adaptive signal linearization. Such a handover decision increases the chances that the UE will be scheduled with a higher order modulation and thus better signal quality.

Modifications, additions, or omissions may be made to method 1400. Additionally, one or more steps in method 1400 of FIG. 14 may be performed in parallel or in any suitable order. Particular steps of method 1400 may be repeated as necessary. The received adaptive signal linearization information may include any suitable combination of the examples of information about adaptive signal linearization capabilities described herein.

FIG. 15 is a flow diagram of another example method in a wireless network element of receiving information of whether a signal linearization technique is applied to a wireless signal, according to some embodiments. In particular embodiments, one or more steps of method 1500 may be performed by components of network 100 described with reference to FIGS. 1-17.

The method begins at step 1510 where the wireless network element receives information indicating that a signal linearization technique is applied to a wireless signal. For example, a wireless device 110 may receive information that a radio network node 120 is capable of applying a signal linearization technique to a wireless signal that will be transmitted to a wireless device 110. In particular embodiments, a wireless network element may receive any suitable information about adaptive signal linearization capabilities of another wireless network element.

In particular embodiments, the wireless network element, such as wireless device 110, may use the received adaptive signal linearization information to adapt its radio receiver for receiving signals from the first radio node.

At step 1512, the wireless network element adapts a configuration of a wireless receiver for receiving the wireless signal. For example, the wireless network element, such as wireless device 110, may use a more robust or effective radio receiver when a signal linearization technique is applied to the received radio signal and use less robust or effective receiver for receiving signals when a signal linearization technique is not applied to the received radio signal. A more robust receiver (e.g., MMSE-IRC) is capable of mitigating interference more effectively compared to a less robust receiver (e.g., MMSE-MRC), but the former is more complex and consumes more computational power than the latter.

At step 1514, the wireless network element receives the wireless signal via the adapted wireless receiver. For example, wireless device 110, having determined radio network node 120 is applying a signal linearization technique and having adapted its wireless receiver to use a MMSE-IRC receiver, receives the wireless signal.

Modifications, additions, or omissions may be made to method 1500. Additionally, one or more steps in method 1500 of FIG. 15 may be performed in parallel or in any suitable order. Particular steps of method 1500 may be repeated as necessary. Although the example in method 1500 describes a wireless device receiving a radio signal from a radio network node, in some embodiments, a radio network node may use the same or similar steps to receive a radio signal from a wireless device.

Figure 16:
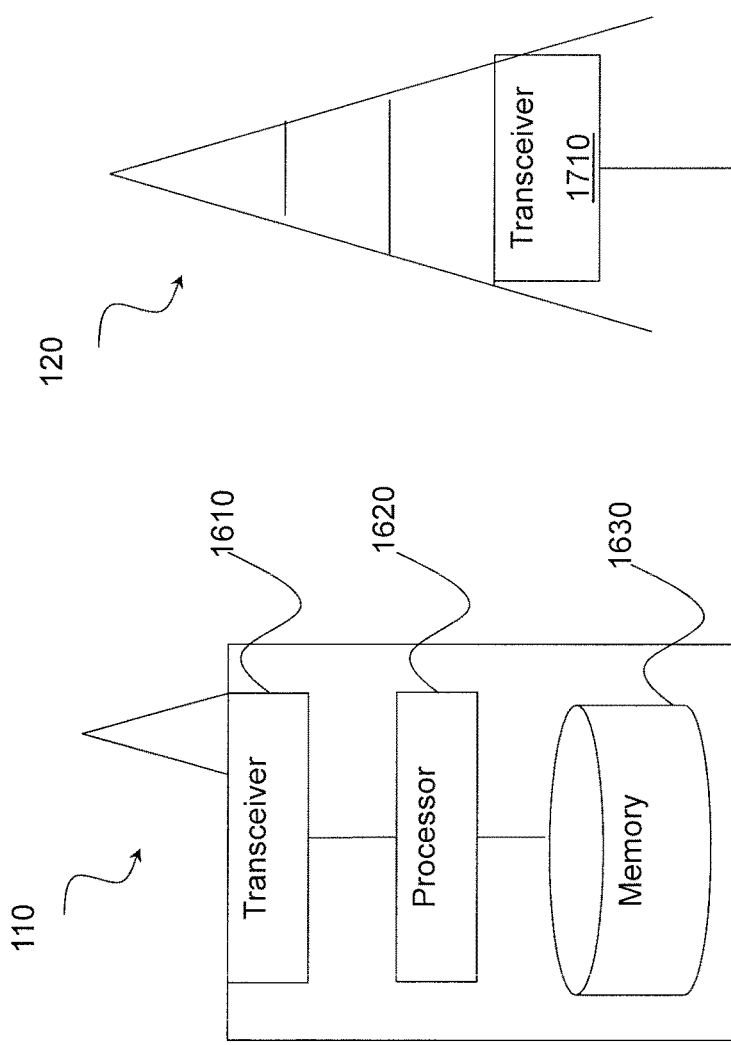
FIG. 16 is a block diagram illustrating an example embodiment of a wireless device.

FIG. 16 is a block diagram illustrating an example embodiment of a wireless device. The wireless device is an example of wireless device 110 illustrated in FIG. 7 and others. Particular examples include a mobile phone, a smart phone, a PDA (Personal Digital Assistant), a portable computer (e.g., laptop, tablet), a sensor, a modem, a machine type (MTC) device/machine to machine (M2M) device, laptop embedded equipment (LEE), laptop mounted equipment (LME), USB dongles, a device-to-device capable device, or any other user equipment or device that can provide wireless communication. The wireless device includes transceiver 1610, processor 1620, and memory 1630. In some embodiments, transceiver 1610 facilitates transmitting wireless signals to and receiving wireless signals from wireless network node 120 (e.g., via an antenna), processor 1620 executes instructions to provide some or all of the functionality described herein as provided by the wireless device, and memory 1630 stores the instructions executed by processor 1620.

Processor 1620 includes any suitable combination of hardware and software implemented in one or more integrated circuits or modules to execute instructions and manipulate data to perform some or all of the described functions of the wireless device. In some embodiments, processor 1620 may include, for example, one or more computers, one more programmable logic devices, one or more central processing units (CPUs), one or more microprocessors, one or more applications, and/or other logic, and/or any suitable combination of the preceding. Processor 1620 may include analog and/or digital circuitry configured to perform some or all of the described functions of wireless device 110. For example, processor 1620 may include resistors, capacitors, inductors, transistors, diodes, and/or any other suitable circuit components.

Memory 1630 is generally operable to store computer executable code and data. Examples of memory 1630 include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or or any other volatile or non-volatile, non-transitory computer-readable and/or computer-executable memory devices that store information.

In particular embodiments, processor 1620 in communication with transceiver 1610 transmits both uplink and downlink radio signal to network node 120. Other embodiments of the wireless device may include additional components (beyond those shown in FIG. 16) responsible for providing certain aspects of the wireless device's functionality, including any of the functionality described above and/or any additional functionality (including any functionality necessary to support the solution described above).

Figure 17:
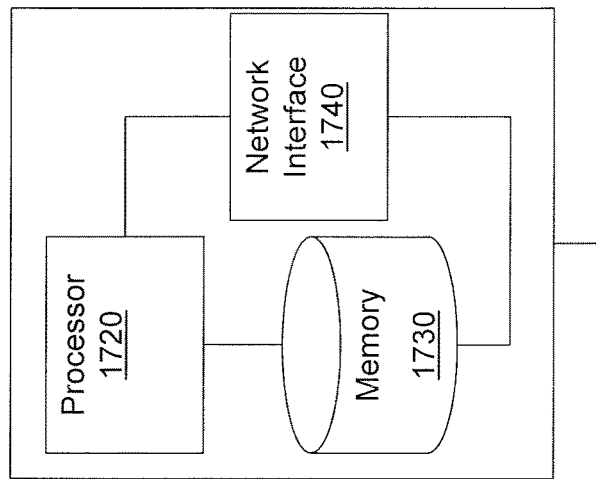
FIG. 17 is a block diagram illustrating an example embodiment of a network node.

FIG. 17 is a block diagram illustrating an example embodiment of a network node. Network node 120 can be an eNodeB, a nodeB, a base station, a wireless access point (e.g., a Wi-Fi access point), a low power node, a base transceiver station (BTS), a transmission point or node, a remote RF unit (RRU), a remote radio head WA, or other radio access node. Network node 120 includes at least one transceiver 1710, at least one processor 1720, at least one memory 1730, and at least one network interface 1740. Transceiver 1710 facilitates transmitting wireless signals to and receiving wireless signals from a wireless device, such as wireless devices 110 (e.g., via an antenna); processor 1720 executes instructions to provide some or all of the functionality described above as being provided by a network node 120; memory 1730 stores the instructions executed by processor 1720; and network interface 1740 communicates signals to backend network components, such as a gateway, switch, router, Internet, Public Switched Telephone Network (PSTN), controller, and/or other network nodes 120. Processor 1720 and memory 1730 can be of the same types as described with respect to processor 1620 and memory 1630 of FIG. 16 above.

In some embodiments, network interface 1740 is communicatively coupled to processor 1720 and refers to any suitable device operable to receive input for network node 120, send output from network node 120, perform suitable processing of the input or output or both, communicate to other devices, or any combination of the preceding. Network interface 1740 includes appropriate hardware (e.g., port, modem, network interface card, etc.) and software, including protocol conversion and data processing capabilities, to communicate through a network.

In particular embodiments, processor 1720 in communication with transceiver 1710 transmits/receives wireless signals, including uplink and downlink signals and control information, to/from wireless device 110. In particular embodiments, processor 1720 in communication with transceiver 1710 transmits uplink and downlink signals as described above to wireless device 110.

Other embodiments of network node 120 include additional components (beyond those shown in FIG. 17) responsible for providing certain aspects of the network node's functionality, including any of the functionality described above and/or any additional functionality (including any functionality necessary to support the solution described above). The various different types of radio network nodes may include components having the same physical hardware but configured (e.g., via programming) to support different radio access technologies, or may represent partly or entirely different physical components.

Some embodiments of the disclosure may provide one or more technical advantages. As an example, adaptive signal linearization techniques conserve computational resources and power by performing signal linearization only when a radio signal would benefit from signal linearization (e.g., signals modulated with a high order modulation scheme). Adaptive signal linearization facilitates low complexity, and thus low cost, radio transmitter implementations that do not significantly reduce user throughput and also satisfy 3GPP error vector magnitude (EVM) requirements. In particular embodiments, system capacity is enhanced because, for example, a base station may simultaneously serve more wireless devices when a signal linearization technique is applied to only a small subset of wireless devices.

Some embodiments may benefit from some, none, or all of these advantages. Other technical advantages may be readily ascertained by one of ordinary skill in the art.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

It will be appreciated by the person of skill in the art that various modifications may be made to the above described embodiments without departing from the scope of the present invention. For example, although embodiments of the present invention have been described with examples that include a communication system compliant to the 3GPP specified LTE standard specification, it should be noted that the solutions presented may be equally well applicable to other networks and network equipment that support signal linearization. The specific embodiments described above should therefore be considered exemplary rather than limiting the scope of the invention. Because it is not possible, of course, to describe every conceivable combination of components or techniques, those skilled in the art will appreciate that the present invention can be implemented in other ways than those specifically set forth herein, without departing from essential characteristics of the invention. The present embodiments are thus to be considered in all respects as illustrative and not restrictive.

Although the preceding embodiments have been described for example purposes, it will be appreciated that other example embodiments include variations of and extensions to these enumerated examples, in accordance with the detailed procedures and variants described above.

In the above-description, the terminology used is for the purpose of describing particular embodiments only and is not intended to be limiting. Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized or overly formal sense expressly so defined herein.

When an element is referred to as being "connected", "coupled", "responsive", or variants thereof to another element, it can be directly connected, coupled, or responsive to the other element or intervening elements may be present. In contrast, when an element is referred to as being "directly connected", "directly coupled", "directly responsive", or variants thereof to another element, there are no intervening elements present. Like numbers refer to like elements throughout. Furthermore, "coupled", "connected", "responsive", or variants thereof as used herein may include wirelessly coupled, connected, or responsive. As used herein, the singular forms "a", "an" and "the" are intended to include the plural forms as well, unless the context clearly indicates otherwise. Well-known functions or constructions may not be described in detail for brevity and/or clarity. The term "and/or" includes any and all combinations of one or more of the associated listed items.

It will be understood that although the terms first, second, third, etc. may be used herein to describe various elements/operations, these elements/operations should not be limited by these terms. These terms are only used to distinguish one element/operation from another element/operation. Thus a first element/operation in some embodiments could be termed a second element/operation in other embodiments without departing from the teachings of present disclosure. The same reference numerals or the same reference designators denote the same or similar elements throughout the specification.

As used herein, the terms "comprise", "comprising", "comprises", "include", "including", "includes", "have", "has", "having", or variants thereof are open-ended, and include one or more stated features, integers, elements, steps, components or functions but does not preclude the presence or addition of one or more other features, integers, elements, steps, components, functions or groups thereof. Furthermore, as used herein, the common abbreviation "e.g.", which derives from the Latin phrase "exempli gratia," may be used to introduce or specify a general example or examples of a previously mentioned item, and is not intended to be limiting of such item. The common abbreviation "i.e.", which derives from the Latin phrase "id est," may be used to specify a particular item from a more general recitation.

Example embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

These computer program instructions may also be stored in a tangible computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks. Accordingly, some embodiments may be embodied in hardware and/or in software (including firmware, resident software, micro-code, etc.) that runs on a processor such as a digital signal processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the disclosure. Moreover, although some of the diagrams include arrows on communication paths to show a primary direction of communication, it is to be understood that communication may occur in the opposite direction to the depicted arrows.

Many variations and modifications can be made to the embodiments without substantially departing from the principles of the present disclosure. All such variations and modifications are intended to be included herein within the scope of present disclosure. Accordingly, the above disclosed subject matter is to be considered illustrative, and not restrictive, and the appended examples of embodiments are intended to cover all such modifications, enhancements, and other embodiments, which fall within the spirit and scope of present disclosure. Thus, the scope of present disclosure are to be determined by the broadest permissible interpretation of the present disclosure, and shall not be restricted or limited by the foregoing detailed description.

Abbreviations used in the preceding description include:
3GPP Third Generation Partnership Project
AM/AM Amplitude-to-Amplitude Modulation
ACLR Adjacent Channel Leakage Ratio
APD Analog Pre-Distortion
BS Base Station
CDMA2000 Code division multiple access 2000
CQI Channel Quality Indication
DAC Digital to Analog Converter
DPD Digital Pre-Distortion
eNB Evolved Node B, base station
EVM Error Vector Magnitude
FDD Frequency Division Duplex
GSM Global System for Mobile communication
HARQ Hybrid Automatic Repeat Request
HSPA High Speed Packet Access
I/Q In-phase/Quadrature
LO Local Oscillator
LTE Long Term Evolution
LTE-LAA LTE-License Assisted Access
M2M Machine-To-Machine
MAC Medium Access Control
MCS Modulation Coding Scheme
MIMO Multiple-Input Multiple-Output
MTC Machine-Type Communication
OFDMA Orthogonal Frequency Division Multiple Access PSTN Public Switched Telephone Network
QAM Quadrature Amplitude Modulation
RF Radio Frequency
RRH Remote Radio Head
RS Reference Signal
RSRQ Reference Signal Received Quality
SC-FDMA Single Carrier Frequency Division Multiple Access
SINR Signal-to-Interference plus Noise Ratio
SNR Signal to Noise Ratio
TDD Time Division Duplex
TTI Transmission Time Interval
UE User Equipment
UMTS Universal Mobile Telecommunications System
WiMAX Worldwide Interoperability for Microwave Access

The invention claimed is:

1. A method of transmitting a radio signal in a first wireless network element, the method comprising:
   signaling, to another wireless network element, information about an ability of the first network element to selectively perform a signal linearization technique;
   receiving, at an input of a radio transmitter, a signal for wireless transmission;
   selectively performing the signal linearization technique on the signal;
   amplifying the signal with a non-linear amplifier; and
   transmitting the amplified signal to a second wireless network element.

2. The method of claim 1, wherein selectively performing the signal linearization technique comprises:
   determining a modulation order of the received signal;
   determining the modulation order exceeds a modulation order threshold; and
   upon determining the modulation order exceeds the modulation order threshold, performing the signal linearization technique.

3. The method of claim 1, wherein selectively performing the signal linearization technique comprises:
   determining an amount of data to be transmitted to the second wireless network element;
   determining the amount of data to be transmitted exceeds an amount threshold; and
   upon determining the amount of data to be transmitted exceeds the amount threshold, performing the signal linearization technique.

4. The method of claim 1, wherein selectively performing the signal linearization technique comprises:
   determining a signal quality of a radio transmission with the second wireless network element;
   determining the signal quality exceeds a signal quality threshold; and
   upon determining the signal quality exceeds the signal quality threshold, performing the signal linearization technique.

5. The method of claim 1, wherein selectively performing the signal linearization technique comprises:
   determining a modulation quality of the signal;
   determining the modulation quality exceeds a modulation quality threshold; and
   upon determining the modulation quality exceeds the modulation quality threshold, performing the signal linearization technique.

6. The method of claim 1, further comprising:
   determining a cell load; and
   adjusting, based on the cell load, one or more thresholds used for selectively performing the signal linearization technique.

7. The method of claim 1, further comprising:
   determining a signal processing capability of the first wireless network element; and
   adjusting, based on the signal processing capability of the first wireless network element, one or more thresholds used for selectively performing the signal linearization technique.

8. The method of claim 1, wherein selectively performing the signal linearization technique comprises:
   determining a highest order modulation capability of the second wireless network element;
   determining the highest order modulation capability does not exceed a modulation order threshold; and
   upon determining the modulation order does not exceed the modulation order threshold, not performing the signal linearization technique.

9. The method of claim 1, wherein the first wireless network element is a wireless device.

10. The method of claim 1, wherein the first wireless network element is a network node.

11. A method in a first wireless network element, the method comprising receiving, from a second wireless network element, an indication of whether a signal linearization technique is applied to a wireless signal transmitted from the second wireless network element.

12. The method of claim 11, further comprising:
   adapting a configuration of a wireless receiver for receiving the wireless signal transmitted from the second wireless network element; and
   receiving, using the adapted wireless receiver, the wireless signal transmitted from the second wireless network element.

13. The method of claim 11, further comprising determining, using the received indication, whether to perform a cell change operation.

14. A wireless network element comprising one or more processors operable to:
   signal, to another wireless network element, information about an ability of the first network element to selectively perform a signal linearization technique;
   receive, at an input of a radio transmitter, a signal for wireless transmission;
   selectively perform the signal linearization technique on the signal;
   amplify the signal with a non-linear amplifier; and
   transmit the amplified signal to a second wireless network element.

15. The wireless network element of claim 14, wherein the processor configured to selectively perform the signal linearization technique is configured to:
   determine a modulation order of the received signal;
   determine the modulation order exceeds a modulation order threshold; and
   upon determining the modulation order exceeds the modulation order threshold, perform the signal linearization technique.

16. The wireless network element of claim 14, wherein the processor configured to selectively perform the signal linearization technique is configured to:
   determine an amount of data to be transmitted to the second wireless network element;
   determine the amount of data to be transmitted exceeds an amount threshold; and upon determining the amount of data to be transmitted exceeds the amount threshold, perform the signal linearization technique.

17. The wireless network element of claim 14, wherein the processor configured to selectively perform the signal linearization technique is configured to:
- determine a signal quality of a radio transmission with the second wireless network element;
- determine the signal quality exceeds a signal quality threshold; and
- upon determining the signal quality exceeds the signal quality threshold, perform the signal linearization technique.

18. The wireless network element of claim 14, wherein the processor configured to selectively perform the signal linearization technique is configured to:
- determine a modulation quality of the signal;
- determine the modulation quality exceeds a modulation quality threshold; and
- upon determining the modulation quality exceeds the modulation quality threshold, perform the signal linearization technique.

19. The wireless network element of claim 14, the processor configured to:
- determine a cell load; and
- adjust, based on the cell load, one or more thresholds used for selectively performing the signal linearization technique.

20. The wireless network element of claim 14, the processor configured to:
- determine a signal processing capability of the first wireless network element; and
- adjust, based on the signal processing capability of the first wireless network element, one or more thresholds used for selectively performing the signal linearization technique.

21. The wireless network element of claim 14, wherein the processor configured to selectively perform the signal linearization technique is configured to:
- determine a highest order modulation capability of the second network element;
- determine the highest order modulation capability does not exceed a modulation order threshold; and
- upon determining the modulation order does not exceed the modulation order threshold, not perform the signal linearization technique.

22. The wireless network element of claim 14, wherein the first wireless network element is a wireless device.

23. The wireless network element of claim 14, wherein the first wireless network element is a network node.

24. A wireless network element comprising one or more processors operable to receive, from a second wireless network element, an indication of whether a signal linearization technique is applied to a wireless signal transmitted from the second wireless network element.

25. The wireless network element of claim 24, the processor further operable to:
- adapt a configuration of a wireless receiver for receiving the wireless signal transmitted from the second wireless network element; and
- receive, using the adapted wireless receiver, the wireless signal transmitted from the second wireless network element.

26. The wireless network element of claim 24, the processor further operable to determine, using the received indication, whether to perform a cell change operation.

* * * * *